United States Patent [19]
Reddy et al.

[11] Patent Number: 5,869,134
[45] Date of Patent: Feb. 9, 1999

[54] CVD OF METALS CAPABLE OF RECEIVING NICKEL OR ALLOYS THEREOF USING IODIDE

[75] Inventors: Srinivasa S. N. Reddy, Lagrangeville; John U. Knickerbocker, Hopewell Junction; Donald R. Wall, Poughkeepsie, all of N.Y.

[73] Assignee: International Business Machines Corporation, Armonk, N.Y.

[21] Appl. No.: 668,295

[22] Filed: Jun. 21, 1996

[51] Int. Cl.⁶ ..................................................... C23C 16/06
[52] U.S. Cl. ........................ 427/250; 427/255; 427/255.1; 427/99; 427/592; 427/593; 428/683; 428/680
[58] Field of Search ................................. 427/585, 99, 96, 427/252, 253, 250, 255, 255.1, 592, 593; 428/615, 663, 680

[56] References Cited

U.S. PATENT DOCUMENTS

| | | | |
|---|---|---|---|
| 3,576,500 | 4/1971 | Gould et al. | 331/94.5 |
| 4,664,942 | 5/1987 | Park . | |
| 4,675,243 | 6/1987 | Obinata et al. | 428/210 |
| 5,240,559 | 8/1993 | Ishida | 456/666 |
| 5,471,033 | 11/1995 | DiPaolo et al. . | |
| 5,575,856 | 11/1996 | Foster et al. | 118/733 |

FOREIGN PATENT DOCUMENTS 0 294 987 A  5/1988  European Pat. Off. .

OTHER PUBLICATIONS

"CRC Handbook of Chemistry and Physics," 63rd ed., R.C. Weast, ed., p. D–200, 1983.
W. L. Robb: "Zirconium Coating Of Uranium By the Iodide Process" Journal Of The Electrochemical Society, vol. 106, No. 2, Feb. 1959, US, pp. 126–129, XP002050779 *Figure 1*.

*Primary Examiner*—Marion McCamish
*Assistant Examiner*—Cheryl Juska
*Attorney, Agent, or Firm*—Aziz M. Ahsan

[57] ABSTRACT

The present invention discloses a CVD (Chemical Vapor Deposition) process where nickel or alloys thereof, such as, Ni/Cu, Ni/Co, are deposited on metal surfaces which are capable of receiving nickel or alloys thereof, using an Iodide source, preferably an Iodide salt, such as, Copper Iodide.

23 Claims, 1 Drawing Sheet

CVD OF METALS CAPABLE OF RECEIVING NICKEL OR ALLOYS THEREOF USING IODIDE

FIELD OF THE INVENTION

The present invention discloses a CVD (Chemical Vapor Deposition) process where nickel or alloys thereof, such as, Ni/Cu, Ni/Co, are deposited on metal surfaces which are capable of receiving nickel or alloys thereof, using an Iodide source, preferably an Iodide salt, such as, Copper Iodide.

BACKGROUND OF THE INVENTION

In the electronics industry it is often desirable to cover or coat an existing refractory metal surface with a brazable or solderable surface. Applications for such a procedure, include but are not limited to, I/O pads, wire bond pads, C4's (Controlled Collapse Chip Connection) and, seal bands, to name a few.

Many methods are available and practiced in the industry to cover or coat an existing refractory metal surface with a brazable or solderable surface. The most commonly used approach for treating refractory metal surfaces in the microelectronic packaging business is to employ electroplating or electroless-plating of pure or substantially pure Ni (nickel) film.

Nickel is generally the metal of choice for plating refractory metals because it can be made to bond well with any of the refractory metals. In addition, Ni possesses good wetting characteristics for subsequent bonding processes, such as brazing or soldering, and it has excellent corrosion characteristics.

U.S. Pat. No. 4,664,942 (Park), is one prior art process for covering surface areas of tungsten or molybdenum with nickel to make the surface brazable or solderable. Park teaches the process of nickel metallization of a ceramic device pre-metallized with Mo or W. In a nickel workboat having a nickel cover, an alumina crucible having Ni/NH$_4$I/Al$_2$O$_3$ particulate mixture is placed. Within this nickel workboat a ceramic device premetallized with molybdenum or tungsten is placed along with a nickel screen. This assembly is then exposed to high temperature to complete the nickel metallization of the premetallized ceramic device.

However, this invention teaches a new process for electroless deposition of a Ni or Ni alloys on a refractory metal surface. It is a CVD process which is performed in a dry environment and at a high temperature using an iodide, preferably an iodide salt, such as, for example, CuI, as the active reagent.

PURPOSES AND SUMMARY OF THE INVENTION

The invention is a novel process where nickel or alloys thereof, are deposited on refractory metal surfaces using a CVD (Chemical Vapor Deposition) process with Iodide.

Therefore, one purpose of this invention is to provide an apparatus and a process that will provide a deposition of nickel or alloys thereof, on refractory metal surfaces with Iodide, preferably an iodide salt, as the active reagents.

Another purpose of this invention is to provide for a process where the container itself is the furnace for the CVD process.

Still another purpose of this invention is to be able to use the material of the container itself as a material for the CVD process.

Yet another purpose of this invention is to provide a non-oxidizing atmosphere for the CVD process.

Still yet another purpose of the invention is to have gas purging means as part of the CVD process.

Therefore, in one aspect this invention comprises a process for depositing nickel or alloys thereof on at least one receiving metal, wherein said receiving metal is securely bonded to a ceramic substrate, comprising the steps of:

(a) placing said ceramic substrate containing said bonded receiving metal in a chamber containing at least one discrete nickel or alloy thereof and a discrete portion of at least one iodide source, (b) heating said chamber and its contents in a non-oxidizing environment at a temperature in the range of from about 700° C. to about 1,000° C., for a period of time ranging to a maximum of about 200 minutes, (c) allowing said chamber and its contents to cool so that said receiving metal has a layer of said nickel or alloys thereof adhered thereto, and (d) removing said ceramic substrate containing said adhered layer of nickel or alloys thereof to said receiving metal, from said chamber.

In another aspect this invention comprises a structure comprising a substrate having at least one receiving metal, at least one crack adjacent to said at least one receiving metal and at least one coating of nickel or alloy thereof on at least a portion of an exposed surface of said at least one receiving metal.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
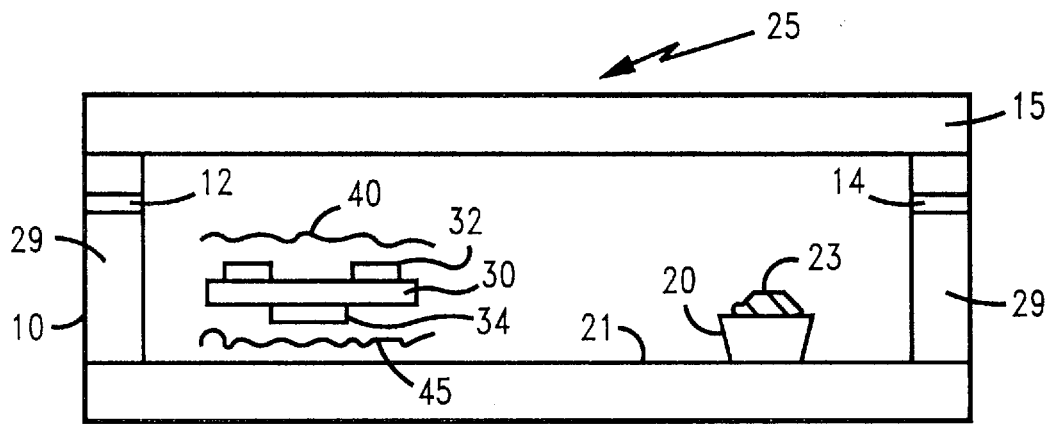
FIG. 1, illustrates a cross-sectional view of a preferred embodiment of this invention.

FIG. 1, illustrates a preferred embodiment of this invention where a boat or container 25, comprising of a box or chamber 10, and cover or lid 15, has a crucible 20, on the base 21, of the box 10. Within the container 25, there are means to support a ceramic body or substrate 30, and deposition metal source 40 and/or 45. The deposition metal source 40 and/or 45, could be selected from a group comprising nickel or nickel alloys. The ceramic body 30, has at least one receiving or refractory metal feature 32, such as, an I/O pad or wire or bond pad or seal band or a line, to name a few, on the first surface, and/or at least one receiving or refractory metal feature 34, such as, an I/O pad or wire or bond pad or seal band or a line, to name a few, on the second surface of the ceramic body 30.

The deposition metal source 40 and/or 45, basically, could be a single nickel screen 40, which would be sufficient to assist in completing the process. One could have more than one nickel screen, such as, a first or upper nickel screen 40, and a second or a lower nickel screen 45. For the purposes of illustration only, the deposition metal source 40 and/or 45, may be referred to as nickel screen 40. Preferably, the nickel screens 40 and 45, are made from a fine nickel mesh. The material for the deposition metal source 40 and/or 45, could be selected from a group comprising pure Ni or Ni/cobalt alloy or Ni/copper alloy. The material for the deposition metal source 40 and/or 45, can be of any shape, size, or configuration, including powder, however, the preferred embodiment is as a fine mesh screen. In order to carry out this invention in some cases the deposition metal source could be an inner wall or lining of the container 25 or 50. The discrete nickel structure could be selected from a group comprising of nickel mesh screen, solid nickel sheet or foil, a nickel lining in the chamber, nickel powder, nickel alloy mesh screen, solid nickel alloy sheet or foil, a nickel alloy lining in the chamber and nickel alloy powder.

The preferred refractory metal 32, is selected from a group comprising molybdenum, tungsten, or alloys or compounds thereof, including mixtures with other materials, such as, WC-Co.

The iodide 23, is preferably a solid CuI salt 23, of no specific shape, size, or configuration. The Iodide material can be used either by themselves or in combinations. It is preferable that the Iodide used in this process melts below the minimum reaction temperature, which is approximately about 700° C., and that boils above the maximum reaction temperature of about 1,000° C. Instead of CuI, the Iodide source could include $CoI_2$, $FeI_2$, $PbI_2$, $MnI_2$, AgI and $VI_2$, to name a few.

Referring again to FIG. 1, the refractory metal 32, usually an exposed terminal of molybdenum or tungsten in the ceramic body 30, the solid deposition metal source 40 and/or 45, such as, Ni or Ni alloy of cobalt or copper, and solid Iodide source 23, such as, CuI salt 23, are placed in the box 10, having the close fitting lid or cover 15, and this assembly is then heated to a temperature of between about 700° to about 1,000° C. and held there for about 1 to about 200 minutes, preferably this assembly is heated between about 850° to about 93° C. and held for between about 10 minutes to about 60 minutes.

The container 25, must be made out of a material that will withstand the high temperature and the corrosive Iodide atmosphere. The material for the container 25, preferably would be graphite, nickel, nickel alloy or ceramic, such as, alumina. The material of the container 25, itself need not participate in the deposition reaction although it can be made to do so, as discussed elsewhere.

It is preferred that the solid Ni or Ni alloy 40 and/or 45, is in close proximity to the refractory metal 32, which is to be plated within the container 25.

It is also preferable that the furnace be continuously purged or flushed with an inert or reducing gas, such as, argon, hydrogen, nitrogen or mixtures thereof.

The preferred Iodide source is CuI 23, which normally will melt at approximately 588° C. and remain a liquid at the reaction temperatures of interest. The melted CuI 23, does not boil until 1,207° C. It is preferred that the CuI 23, be contained in a crucible 20, such as, alumina crucible within the container 25, so that when it melts it will be contained within the crucible 20. Although this is not a requirement, the CuI 23, could simply be contained in the bottom or base 21, of the reaction vessel or container 25, as clearly shown in FIG. 2. Upon cool down the CuI 23, will re-solidify and the unused portion can be reused in subsequent runs.

At high temperature the liquid CuI 23, bath will try to maintain equilibrium with its vapor. The CuI 23, vapor pressure is merely a function of temperature and thus can be easily controlled or accurately altered within any application by simply changing the temperature of the reaction system. The vapor pressure of CuI 23, varies from approximately about 0.009 atmosphere at about 700° C. to about 0.18 atmosphere at about 1,000° C.

The CuI 23, in the vapor phase will react with the solid Ni or Ni alloy source 40 and/or 45, present in the container 25, to form gaseous products of Ni iodides. It is presumed that the gaseous Ni iodide species moves and reacts with the exposed surface of the refractory metal 32. The nickel species is then reduced and substantially pure nickel is then deposited. The iodide is liberated from the surface of the refractory metal 32, and returns to the Ni or Ni alloy solid source 40 and/or 45, and reacts again with Ni to repeat the process. In this way the Iodide in simply a carrier of the Ni and does not get consumed in the process. For this reason only a relatively small amount of Iodide 23, reagent, is used up in any one run, as long as the lid 15, is closely fitted to the box 10, such that, the gas in the container 25, cannot readily escape from the container 25, by any rapid mass transfer mechanism.

Using this Chemical Vapor Deposition process Ni films can be built upon the surfaces of the refractory metal 32. It has been seen that the thickness of this nickel layer 42, can be from about a thickness of say about 0.01 microns to layers exceeding about 10–15 microns.

Upon cool down the gaseous iodides in the container 25, condense and the remaining CuI liquid in the container re-solidifies. The coated or plated parts 30, can now be removed from the container 25, having all the previously exposed refractory metal surfaces 32, plated with and well bonded to a Ni or Ni alloy film of copper and or cobalt 42. The solid Ni or Ni alloy source 32, in the container 25, like the remaining CuI 23, reagent, can be reused in subsequent runs.

The container 25, can have a gas inlet/outlet 12, and a gas outlet/inlet 14. The gas inlets 12 and 14, are normally used for purging, and for creating the non-oxidizing environment inside the chamber 25. The purging gases or the non-oxidizing environment is typically selected from a group consisting of argon, hydrogen, nitrogen, argon plus hydrogen, argon plus nitrogen, and hydrogen plus nitrogen.

Figure 2:
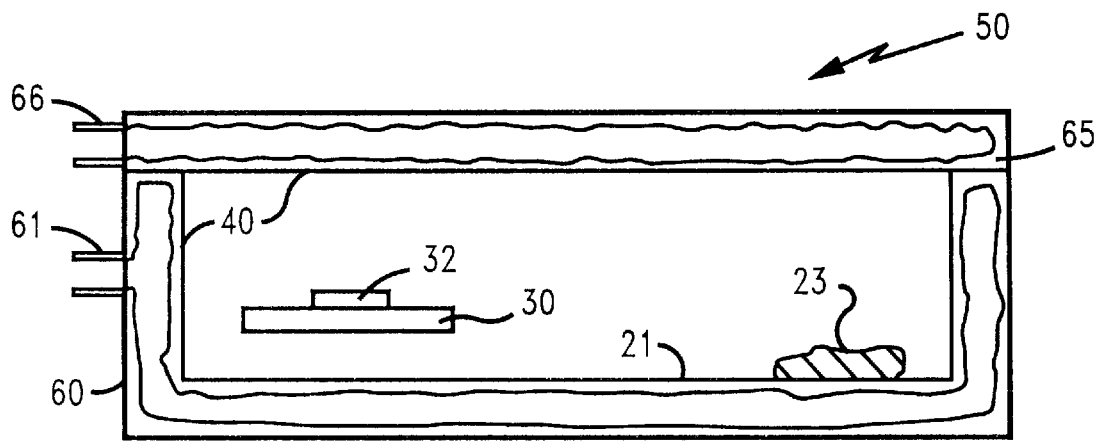
FIG. 2, illustrates a cross-sectional view of another embodiment of this invention.

The chamber could be a single piece unit as shown in FIG. 2, with a chamber 60, or a multi-piece unit as shown in FIG. 1, where a box or chamber 10, has a base piece 28, and side-wall pieces 29.

FIG. 2, illustrates another embodiment of this invention. The process for coating the refractory metal features 32, is the same as already discussed with reference to FIG. 1, except that the container itself now is an oven. The container 50, has a box 60, with a lid or cover 65. The box 60, has a heating means 61, such as, a resistance heater 61. Similarly, the cover or lid 65, has a heating means 66, such as, a resistance heater 66. The heating means 61 and/or 66, could be embedded, as clearly shown in FIG. 2, or they could be outside the container 25 and/or 50. The only requirement for the heating means 61 and 66, is that they should be able to bring the inside temperature of the box 25 and/or 50, to the desired processing temperature.

Figure 3:
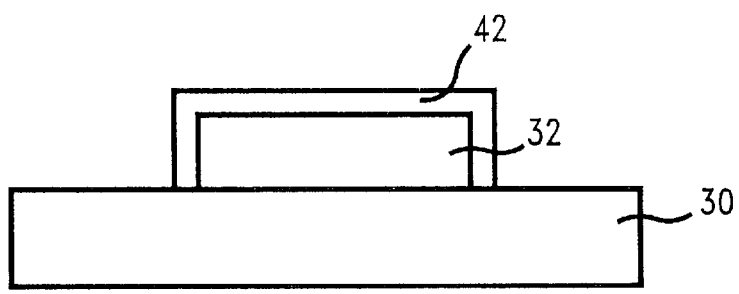
FIG. 3, illustrates a cross-sectional view of a ceramic substrate after it has gone through nickel deposition process of this invention.

FIG. 3, illustrates a cross-sectional view of the ceramic substrate 30, having the refractory metal features 32, such as, pads or lines, after it has gone through the nickel deposition process as described in FIGS. 1 and 2. As shown in FIG. 3, the substrate 30, having refractory metal features 32, has an additional layer of the nickel or alloy thereof 42, deposited with this process.

Because this Nickel deposition process is done dry, rather than wet, as in electroplating or in electroless plating, the phenomenon of stress corrosion cracking in metallized ceramic ware being plated is reduced. This can be very important, for example, for substrates using C4 technology to package electronic dies. The C4 vias are small in diameter and are set close together on tight grids. Often due to stress corrosion cracking during wet processing, such as, in traditional nickel plating, cracks between the C4 vias will propagate. These cracks can result in electronic shorts between vias and thus create both functional and reliability concerns.

The current solution in the industry is to limit close configured designs and to employ stress relief vias. Stress relief vias take-up real estate in design, but provide no function other than to help to avoid C4 via to via cracks.

Therefore, the nickel film that is deposited using this invention is unique, because it can be deposited dry, such that the phenomenon of stress corrosion causing C4 via to via cracks is either substantially reduced or eliminated. Thus making possible tighter more efficient electronic design in a substrate or electronic package.

Figure 4:
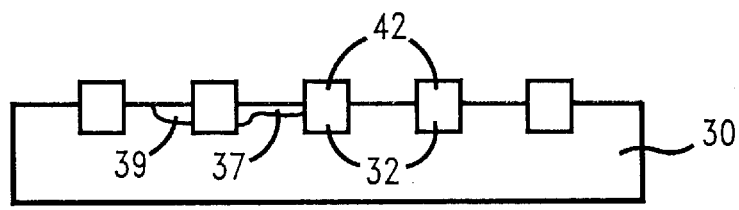
FIG. 4, illustrates a cross-sectional view of a substrate having at least one partial and at least one via to via crack that has successfully gone through the nickel deposition process of this invention.

FIG. 4, illustrates a cross-sectional view of a substrate 30, having at least one partial crack 39, and at least one via to via crack 37, that has successfully gone through the nickel deposition process of this invention. As shown the substrate 30, has at least one receiving metal 32, and at least one crack adjacent to the receiving metal 32, and at least one coating of nickel or alloy thereof 42, on at least a portion of an exposed surface of the receiving metal 32. Under the wet process metal would enter the cracks 37 and 39, and create electrical problems, such as, for example, shorts if one had a via to via crack 37. Whereas with this dry process one can successfully use substrates 30, which earlier may have had to be discarded or may have had a limited use.

As seen clearly in FIG. 1, that the reactants are first placed inside a container and then the container 25, with or without the cover 15, is placed inside a furnace or oven. However, one could achieve the same processing results by making the container the oven itself, as shown in FIG. 2.

For most applications it is desired that the box along with the cover are preferably of a low profile and are heated in any conventional oven, such as, a continuous belt furnace, etc.

However, in some applications one could put the box 10, without the cover or lid 15, in an open furnace where the gaseous Iodide source are contained and supplied by the flushing gas in the furnace.

It is preferred that the environment within the furnace is non-oxidizing. One way to do it would be to use flushing gas in the furnace which contains hydrogen for better control of tramp oxygen in the system. In some situations the box could be pre-purged before firing of all tramp oxygen with either an inert gas or with a hydrogen containing gas mixture. However, the gases for the pre-purge or the non-oxidizing environment could be selected from a group consisting of argon, hydrogen, nitrogen, argon plus hydrogen, argon plus nitrogen, and hydrogen plus nitrogen.

In some cases a carbon source would be needed to control the oxygen pressure inside the container, in those cases it is preferable that graphite is used inside the box so as to control the oxygen pressure in the box during the high temperature reaction. It should be understood that where carbon is required the box and/or the lid could themselves be made from a carbon source and in those cases no additional carbon source would be needed.

It has been shown that if a Ni or Ni alloy box or lid is used, then in that case no other solid Ni or Ni alloy source may be needed because in such cases the Ni box may act as the only source of Ni for deposition.

It may be preferable that the cover 15 or 65, is used so as to seal the container 25 or 50. This helps to ensure that no hazardous or corrosive gas is allowed to bleed into the furnace or into the exhaust.

It should be understood that the Ni source metal and/or alloy 40 and/or 45, can be combined with the reagent CuI 23, in a crucible 20, within the box 10 or 60, preferably as a powder, in order to carry out the process of this invention.

It is preferred that the ceramic substrate and exposed surfaces of the at least one receiving metal are cleaned prior to the process of this invention.

The heating of the chamber and its contents are preferably done in a furnace. There are many types of furnaces available in the market, however, the furnace could be selected from a group comprising of a vertical furnace, a continuous belt furnace or a sequential belt furnace.

The process of this invention provides numerous advantages over the prior art processes, such as, for example, the nickel film that is grown in all the cases is more uniform with a reduced incidence of the formation of nuggets or nodules or ridges in the film or layer. This allows for a thicker film to be deposited uniformly thus facilitating the covering or plating of non-metallic or non-plateable phases of larger size.

This process uses substantially less chemicals, which has a direct impact on the cost as well as the reduction of products that are harmful to the environment. Gas scrubbing is also reduced.

The iodide partial pressure is also controlled with this process. This is due to the iodide melt in the reactor at maximum temperature, seeking to maintain equilibrium with its vapor. One favorable consequence is that the containment vessel "seal" is not that critical. This also helps in scaling up the process for manufacturing applications.

It should also be appreciated that, if desired or required, this process can be done in a hydrogen free environment, unlike the prior art, and under these circumstances the undesirable hydrogen reactions can therefore be avoided.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for depositing nickel or alloys thereof on at least one receiving metal, wherein said receiving metal is securely bonded to a ceramic substrate, comprising the steps of:

(a) placing said ceramic substrate containing said receiving metal in a chamber containing at least one discrete nickel material or alloy thereof and a discrete portion of at least one iodide source, and wherein said at least one iodide source melts below minimum reaction temperature, which is approximately about 700° C., and that said at least one iodide source boils above maximum reaction temperature of about 1,000° C., (b) heating said chamber and its contents in a non-oxidizing environment at a temperature in the range of from about 700° C. to about 1,000° C., for a period of time ranging to a maximum of about 200 minutes, (c) allowing said chamber and its contents to cool so that said receiving metal has a layer of said nickel material or alloys thereof adhered thereto, and (d) removing said ceramic substrate containing said adhered layer of nickel material or alloys thereof to said receiving metal, from said chamber.

2. The process of claim 1, wherein said receiving metal bonded to said ceramic substrate is selected from a group consisting of molybdenum, tungsten and alloys, compounds or mixtures thereof.

3. The process of claim 1, wherein said alloys of nickel material are selected from a group consisting of nickel-copper and nickel-cobalt.

4. The process of claim 1, wherein said at least one discrete nickel material or alloy thereof is selected from a group consisting of nickel mesh screen, solid nickel sheet, a nickel lining in said chamber, nickel powder, nickel alloy mesh screen, solid nickel alloy sheet, a nickel alloy lining in said chamber and nickel alloy powder.

5. The process of claim 1, wherein said chamber has at least one inlet for at least one non-oxidizing gas and at least one outlet for said non-oxidizing gas.

6. The process of claim 5, wherein said non-oxidizing gas is selected from a group consisting of argon, hydrogen, nitrogen, argon plus hydrogen, argon plus nitrogen, and hydrogen plus nitrogen.

7. The process of claim 1, wherein said chamber has at least one cover to protect contents inside said chamber.

8. The process of claim 1, wherein said chamber has at least one cover to protect contents inside said chamber and furthermore said cover has at least one heating means to heat said chamber.

9. The process of claim 8, wherein said heating means is at least one embedded heating resisting means to heat said chamber.

10. The process of claim 1, wherein said chamber has at least one heating means to heat said chamber.

11. The process of claim 10, wherein said heating means is at least one embedded heating resisting means to heat said chamber.

12. The process of claim 1, wherein said non-oxidizing environment is selected from a group consisting of argon, hydrogen, nitrogen, argon plus hydrogen, argon plus nitrogen, and hydrogen plus nitrogen.

13. The process of claim 1, wherein said substrate is selected from a group consisting of ceramic, glass ceramic and multilayered ceramic.

14. The process of claim 1, wherein in step (b) said chamber and its contents are heated in said non-oxidizing environment at a temperature in the range of from about 850° C. to about 930° C., for a period of ranging between about 10 minutes to about 60 minutes.

15. The process of claim 1, wherein thickness of said layer of nickel material or alloy thereof, over said receiving metal is between about 0.01 micron to about 15 microns.

16. The process of claim 1, wherein said at least one iodide source is selected from a group consisting of CuI, $CoI_2$, $FeI_2$, $PbI_2$, $MnI_2$, AgI and $VI_2$.

17. The process of claim 1, wherein said at least one iodide source is contained within at least one crucible.

18. The process of claim 1, wherein said at least one iodide source, and said nickel material or alloy thereof, are contained within at least one crucible.

19. The process of claim 1, wherein said ceramic substrate and exposed surfaces of said at least one receiving metal are cleaned prior to step (a).

20. The process of claim 1, wherein said heating of said chamber and its contents are done in a furnace.

21. The process of claim 1, wherein said heating of said chamber and its contents are done in a furnace, and wherein said furnace is selected from a group consisting of a vertical furnace, a continuous belt furnace or a sequential belt furnace.

22. The process of claim 1, wherein said ceramic substrate has at least one crack adjacent to said at least one receiving metal.

23. The process of claim 1, wherein thickness of said layer of nickel material or alloy thereof, over said receiving metal is between about 3 microns to about 10 microns.

* * * * *